United States Patent
Sekijima et al.

(10) Patent No.: US 7,166,162 B2
(45) Date of Patent: Jan. 23, 2007

(54) TERBIUM TYPE PARAMAGNETIC GARNET SINGLE CRYSTAL AND MAGNETO-OPTICAL DEVICE

(75) Inventors: Takenori Sekijima, Kusatsu (JP); Mikio Geho, Otsu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 261 days.

(21) Appl. No.: 10/494,292

(22) PCT Filed: Sep. 17, 2003

(86) PCT No.: PCT/JP03/11820

§ 371 (c)(1),
(2), (4) Date: May 3, 2004

(87) PCT Pub. No.: WO2004/029339

PCT Pub. Date: Apr. 8, 2004

(65) Prior Publication Data

US 2005/0157219 A1    Jul. 21, 2005

(30) Foreign Application Priority Data

Sep. 27, 2002 (JP) ............ 2002-283541

(51) Int. Cl.
*C30B 29/16* (2006.01)
(52) U.S. Cl. .............. 117/81; 117/83; 252/361 R; 252/301.4 R
(58) Field of Classification Search ......... 117/81, 117/83; 252/361 R, 301.4 R
See application file for complete search history.

(56) References Cited

U.S. PATENT DOCUMENTS

| 5,360,557 A * | 11/1994 | Tsoukala et al. ........ 250/361 R |
| 5,391,867 A * | 2/1995 | Grumberg ............... 250/208.1 |
| 7,008,558 B1 * | 3/2006 | Vartuli et al. ......... 252/301.4 R |
| 2003/0127630 A1 * | 7/2003 | Vartuli et al. ......... 252/301.4 R |
| 2004/0056655 A1 * | 3/2004 | Sekijima et al. ......... 324/244.1 |

FOREIGN PATENT DOCUMENTS

| EP | 1 074 872 A2 | 2/2001 |
| JP | 60-186859 | 9/1985 |
| JP | 8-12498 A1 | 1/1996 |
| JP | 2001-44026 A1 | 2/2001 |
| JP | 2002-255688 A1 | 9/2002 |

OTHER PUBLICATIONS

S. Ganschow, et al.; "On the Crystallization of Terbium Aluminium Garnet"; *Cryst. Res. Technol*; 34; 1999; pp. 615-619.

* cited by examiner

Primary Examiner—Robert Kunemund
(74) Attorney, Agent, or Firm—Dickstein Shapiro LLP (57) ABSTRACT

A terbium type paramagnetic garnet single crystal having a high Faraday effect and a high light transmission factor even in a visible range, as well as a high Verdet constant. A magneto-optical device containing the terbium type paramagnetic garnet single crystal. The terbium type paramagnetic garnet single crystal contains at least terbium, at least one element of aluminum and gallium, and a part of the terbium is replaced by at least one element of cerium and praseodymium.

4 Claims, 7 Drawing Sheets

- - - - - - $Tb_3Al_5O_{12}$ (SAMPLE 1)
——— $Tb_{2.8}Ce_{0.2}Al_5O_{12}$ (SAMPLE 7)
——— $Tb_{2.8}Pr_{0.2}Al_5O_{12}$ (SAMPLE 10)

TERBIUM TYPE PARAMAGNETIC GARNET SINGLE CRYSTAL AND MAGNETO-OPTICAL DEVICE

FIELD OF THE INVENTION

The present invention relates to a terbium type paramagnetic garnet single crystal having a garnet structure containing at least terbium and at least one element of Al and Ga, which is suitable for use in an optical isolator and an optical circulator in optical communication and optical recording and for use in a magneto-optical sensor for detection of large current.

DESCRIPTION OF THE BACKGROUND ART

In the recent electric power field, great attention has been paid to magneto-optical sensors which contain magneto-optical materials, and are suitable for detecting abnormal currents in power transmission lines which may be caused by thunder-bolts or the like. The sensors can detect magnetic fields generated around power transmission lines utilizing the Faraday effect, which is a kind of magneto-optical effect. The detection is carried out utilizing the fact that the Faraday rotational angle is changed depending on the intensity of a magnetic field. It is generally known that when a magneto-optical element having the Faraday effect is irradiated with a laser beam, and a magnetic field is generated in the same direction as the propagation direction of the laser beam, the polarization plane of the incident laser beam is rotated in proportion to the intensity of the magnetic field. Polarizing plates having different polarization planes are arranged on the front and back sides in the light propagation direction of the magneto-optical element, utilizing the above-described rotation of the polarization plane. Accordingly, the difference between the rotational angles of the polarization planes causes the difference between the light-quantities to appear. The difference between the light-quantities is detected by a light-sensing means such as a photodetector or the like. Thus, the strength of abnormal current can be detected. Magneto-optical sensors using the Faraday effect as described above have a high sensitivity. Moreover, the sizes and weights can be reduced. Furthermore, the explosion-proof performance is high, and the sensors can be remote-controlled. Also, since optical fibers are used for propagation of light, the electromagnetic induction noise levels and the insulating properties are superior. Thus, the magneto-optical sensors have superior characteristics compared to electrical type magnetic field sensors.

Referring to the characteristics of paramagnetic materials to form magneto-optical elements, it has been required that the Verdet constant (V: (deg/(Oe·cm))) is high. The Verdet constant means a Faraday rotational angle per unit length and per unit applied magnetic field. The Verdet constant has a relationship represented by $\theta_f = VHd$, in which $\theta_f$ represents a Faraday rotational angle (i.e., the angle of a polarized light beam), d represents a movement distance of the light beam which passes through the magneto-optical element, and H represents the intensity of a magnetic field applied to the magneto-optical element. According, the change ratio of the Faraday rotational angle increases as the Verdet constant becomes larger. Thus, the difference between light-quantities increases when the magnetic field is slightly changed. Thus, a magneto-optical sensor having a high sensitivity can be provided.

As a magnetic material having the above-described properties, a single crystal having an yttrium iron garnet structure ($Y_3Fe_5O_{12}$: hereinafter, referred to as YIG for short) is used as a ferromagnetic material described in Japanese Examined Patent Application Publication No. 2-3173. The YIG single crystal is advantageous in that the Verdet constant is large, and the sensitivity to magnetic variation is high. However, the YIG single crystal described in Japanese Examined Patent Application Publication No. 2-3173 has the following problems: the Faraday rotational angle increases until the intensity of a magnetic field reaches a predetermined value, and then becomes constant after the intensity reaches the predetermined value, i.e., the Faraday rotational angle becomes magnetically saturated. Therefore, when the YIG single crystal is used as a magneto-optical element of a magneto-optical sensor for detection of large current, problems occur in that the sensor can not accurately detect electric current. Also, the YIG single crystal can transmit only light rays in an infrared range of 1000 nm to 5000 nm. Thus, problematically, the YIG single crystal cannot be used in a visible range of 400 nm to 600 nm and at a wavelength of 650 nm. The wavelength of 650 nm is in the wavelength range for plastic fibers, which has been investigated for use in LAN or the like which is mounted on cars. Light sources for use in an infrared range are expensive. On the other hand, light sources in a visible range are inexpensive. Thus, it is desired to realize a paramagnetic material which can be used in a visible range.

As a magnetic material which can solve the above-described problems, a terbium .aluminum type paramagnetic garnet single crystal ($Tb_3Al_5O_{12}$, hereinafter, referred to as TAG single crystal for short) containing at least Tb and Al is described, for example, by S. Ganschow, D. Klimm, P. Reiche and R. Uecker; Cryst. Res. Technol., 34 (1999) pp. 615–619. The Verdet constant of the TAG single crystal is very large compared to the Verdet constants of other paramagnetic materials. Thus, even if the size of the single crystal is reduced, a sufficient Faraday rotational angle can be obtained. Accordingly, the sizes of magneto-optical elements can be reduced. Furthermore, even if a strong magnetic field is applied, no magnetic saturation occurs in contrast to the YIG single crystal. Therefore, the TAG single crystal can be used as a magneto-optical element of a magneto-optical device for detection of large electric current. Hence, the TAG single crystal can detect a wide range of magnetic field intensity. The TAG single crystal has a very high light transmission factor in a light wavelength range of 500 nm to 1400 nm. In addition, it has been revealed that the TAG single crystal can be provided with a high light transmission factor in a visible range of 400 nm to 700 nm in wavelength. It has also been suggested to use the TAG single crystal having the above-described superior properties in magneto-optical devices.

Although the TAG single crystal has the above-described superior properties, no TAG single crystals with a size large enough to be practically applied in magneto-optical devices have been realized. The reason for this is that the TAG single crystal is a decomposition-melting type compound. Thus, the composition of starting raw materials obtained when the materials are melted is different from the composition of a crystal obtained when the melted raw materials are cooled. More specifically, the decomposition-melting type TAG single crystal composed of a garnet phase cannot be obtained directly from the composition of the melted starting raw materials. Thus, problems occur in that $TbAlO_3$ composed of a perovskite phase is mixed with the TAG single crystal. The TAG single crystal has the largest Verdet constant of the paramagnetic dielectrics. However, the Verdet constant of the TAG single crystal when it is irradiated with a light beam with a wavelength of 633 nm is about 0.01°/(Oe·cm). Thus, for application of the TAG crystal for magneto-optical devices, the TAG single crystal is required to have a larger Verdet constant.

As another terbium type paramagnetic garnet single crystal, for example, terbium.gallium.garnet ($Tb_3Ga_5O_{12}$: hereinafter, referred to as TGG single crystal for short) or the like is known. However, the Verdet constant must be increased similar to that of the TAG single crystal. The TGG single crystal is a coincidently melting type material. That is, the composition of the starting raw materials of the TGG single crystal is the same as that obtained after the crystal is grown. Thus, the TGG single crystal having a practical size can be easily produced by the known Czochralski process. However, the obtained TGG single crystal has problems in that the Verdet constant at a wavelength of 633 nm is small, i.e., 0.0075°/(Oe·cm). Magneto-optical materials which have a large Verdet constant and are effective in size-reduction are desired for the decomposition-melting type TAG single crystal and also coincidently melting type terbium type paramagnetic garnet materials.

It is an object of the present invention to solve the above-described problems and to provide a terbium type paramagnetic garnet single crystal of which the Faraday effect is large, the light transmission factor is high, and the Verdet constant is enhanced, and to provide a magneto-optical device using the terbium type paramagnetic single crystal.

BRIEF SUMMARY OF THE INVENTION

To achieve the above-described object, according to a first embodiment of this invention, there is provided a terbium type paramagnetic garnet single crystal containing at least terbium and at least one element of aluminum and gallium, wherein at least one element of cerium and praseodymium is substituted for a part of the terbium.

Preferably, in the terbium type paramagnetic garnet single crystal according to a second embodiment of this invention, the single crystal is represented by the following chemical formula: $(Tb_{3-x}M_x)N_5O_{12}$, in which M represents at least one element of Ce and Pr, N represents at least one of Al and Ga, and x is in the range of $0.01 \leq x \leq 2$.

Preferably, in a terbium type paramagnetic garnet single crystal according to a third embodiment of this invention, the single crystal is represented by the following chemical formula: $(Tb_{3-x}M_x)N_5O_{12}$, in which M represents Ce, N represents at least one of Al and Ga, and x is in the range of $0.01 \leq x \leq 1$.

Preferably, in a terbium type paramagnetic garnet single crystal according to a fourth embodiment of this invention, the single crystal is represented by the following chemical formula: $(Tb_{3-x}M_x)N_5O_{12}$, in which M represents Pr, N represents at least one of Al and Ga, and x is in the range of $0.01 \leq x \leq 2$.

Preferably, the magneto-optical device according to a fifth embodiment of this invention includes, as a magneto-optical element, the terbium type paramagnetic single crystal defined in the first to fourth embodiments of this invention.

As described above, with the composition according to the first embodiment, a terbium type paramagnetic garnet single crystal having a Verdet constant larger than that of the non-substitution type TAG single crystal or TGG single crystal can be provided. A small-sized magneto-optical device which can transmit even a visible light can be provided by use of the above-described terbium type paramagnetic garnet single crystal.

Moreover, with the compositions according to the second to fourth embodiments of this invention, a terbium type paramagnetic garnet single crystal having a large Verdet constant can be securely provided. Preferably, according to the fourth embodiment, Pr is substituted with high stability.

Moreover, according to the fifth embodiment of this invention, the magneto-optical device has a larger Verdet constant, and thus, a magneto-optical device having a larger Faraday effect can be provided. This device can transmit even a visible light with a wavelength range of 400 to 650 nm. Thus, a magneto-optical device which copes with a laser having a wavelength in a visible range can be provided.

DESCRIPTION OF THE PREFERRED EMBODIMENTS OF THE INVENTION

Hereinafter, the terbium type paramagnetic garnet single crystal of the present invention and the magneto-optical element using the single crystal will be described.

In the terbium type paramagnetic garnet single crystal containing at least terbium and at least one element of aluminum and gallium of the present invention, at least one element of cerium and praseodymium is substituted for a part of the terbium. Both cerium and praseodymium may be added. Preferably, the single crystal is represented by the following chemical formula:

$(Tb_{3-x}M_x)N_5O_{12}$.

Preferably, at least one element of Ce and Pr is substituted as M, at least one of Al and Ga is substituted as N. Preferably, x is in the range of $0.01 \leq x \leq 2$.

In the case where cerium is substituted for a part of the terbium, preferably, x is in the range of $0.01 \leq x \leq 1.0$ If x is less than 0.01, effects of the substitution of Ce are not sufficient. If x is more than 1.0, the Verdet constant becomes saturated and is kept constant, even if Ce is further substituted because the amount of Ce exceeds the solution limit of Ce in the terbium type paramagnetic garnet. Moreover, if an excess amount of Ce is added, the Ce not solid-dissolved segregates in the crystal, and thus, undesirably, the transmission factor may decrease.

In the case where praseodymium is substituted for a part of the terbium, preferably, x is in the range of $0.01 \leq x \leq 2.0$. If x is less than 0.01, effects of the substitution of praseodymium are not sufficient. Therefore, undesirably, the Verdet constant does not become large. If x is more than 2.0, the amount of praseodymium exceeds the solution limit of praseodymium in the terbium type paramagnetic garnet.

Moreover, if an excess amount of praseodymium is added, the praseodymium not solid-dissolved segregates in the crystal, and thus, undesirably, the transmission factor may decrease. Since the solid-solution limit of praseodymium is 2.0, praseodymium can be substituted for a part of the terbium in a larger amount compared to cerium. Thus, a larger Verdet constant can be obtained. Cerium and praseodymium, when they have a valence number of 3, contribute directly to the Faraday effect. However, cerium is more stable in the form of $Ce^{4+}$ than in the form of $Ce^{3+}$. Accordingly, even if it is attempted to simply substitute cerium $CeO_2$ may be deposited. Therefore, in the case where cerium is substituted, the crystallization and growth must be carried out in a reducing atmosphere. On the other hand, when praseodymium is substituted, the crystallization and growth can be easily carried out since the praseodymium is stable in the form of $Pr^{3+}$ and is easily substituted. Moreover, the crystal can be grown in the atmosphere. Therefore, praseodymium is more preferable than cerium.

Moreover, in the terbium type paramagnetic garnet single crystal of the present invention, one element of cerium and praseodymium is substituted for a part of the terbium, and moreover, a rare earth element other than cerium and praseodymium may be substituted for a part of the terbium. Preferably, La, Nd, Sm, Eu, Gd, Dy, Ho, Er, Tm, Yb, Lu, or the like is used as the rare earth element. In the case where such a rare earth element is added, the terbium type paramagnetic garnet single crystal is represented by the following formula: $(Tb_{3-x-y}M_xR_y)N_5O_{12}$, in which M represents at least one element of cerium and praseodymium, and N represents at least one element of aluminum and gallium. Preferably, y is in the range of from 0 to 1. In other words, the rare earth element does not have to be added. Moreover, if y exceeds 1, undesirably, the Verdet constant decreases since the total number of terbium ions significantly contributing to the Faraday effect decreases.

According to the present invention, Fe may be contained as impurities. However, the amount is preferably less than 50 ppm. In some cases, the Fe can not substantially be detected, depending on the type of analytical device.

Moreover, in the terbium type paramagnetic garnet single crystal of the present invention, one element of cerium and praseodymium is substituted for a part of the terbium, and moreover, a rare earth element other than cerium and praseodymium may be substituted for a part of the terbium. Preferably, La, Nd, Sm, Eu, Gd, Dy, Ho, Er, Tm, Yb, Lu, or the like is used as the rare earth element. In the case where sun a rare earth element is added, the terbium type paramagnetic garnet single crystal is represented by the following formula: $(Tb_{3-x-y}M_xR_y)N_5O_{12}$, in which M represents at least one element of cerium and praseodymium, and N represents at least one element of aluminum and gallium. Preferably, y is in the range of from 0 to 1. In other words, the rare earth element does not have to be added. Moreover, if y exceeds 1, undesirably, the Verdet constant decreases, since the total number of terbium ions significantly contributing to the Faraday effect decreases.

According to the present invention, Fe may be contained as impurities. However, the amount is less than 50 ppm. In some cases, the Fe can not substantially be detected, depending on the type of an analytical device.

Referring to an appropriate method of producing the TAG single crystal of the present invention, preferably, a raw material bar has a paramagnetic garnet structure containing at least Tb and Al, and at least one of the raw material bar and the seed crystal is porous. Preferably, the production is carried out by the laser FZ method comprising a first step of preparing the raw material bar and the seed crystal, a second step of melt-bonding the raw material bar and the seed crystal to each other by irradiation with light energy, and a third step of shifting the light energy irradiation area from the melt-bonding portion to the raw material bar side.

A perovskite phase of $TbAlO_3$ or the like can be eliminated from the melting zone, and the TAG single crystal can be easily formed by the above-described production method. Thus, such a large TAG single crystal as can not be produced by the known production methods can be easily produced according to the present invention. Thereby, the number of chips formed by cutting of the TAG single crystal can be increased, and can be positively used as materials for magneto-optical devices. According to the known production methods, regarding $Tb_3Al_5O_{12}$ which is a decomposition melting type, first, a perovskite phase is formed in the solid-liquid interface between the melting zone and the solid, and thereafter, $Tb_3Al_5O_{12}$ is formed. Thus, inevitably, the garnet phase and the perovskite phase are mixed together. For the known FZ method, the raw material bar and the seed crystal are required to have a high density. To the contrary, it is found by the inventors that at least one of the raw material bar and the seed crystal is formed so as to be porous, and the raw material bar and the seed crystal are melt-bonded to each other by application of light-energy, resulting in formation of a melting zone, wherein the melt-liquid penetrates into the porous medium, and the perovskite phase generated as an initial phase precedently deposited in the porous medium. Thus, the perovskite phase is eliminated from the melting zone by the deposition of the perovskite phase as an initial phase into the porous medium as described above. Thus, a larger terbium type garnet single phase can be obtained.

Figure 1:
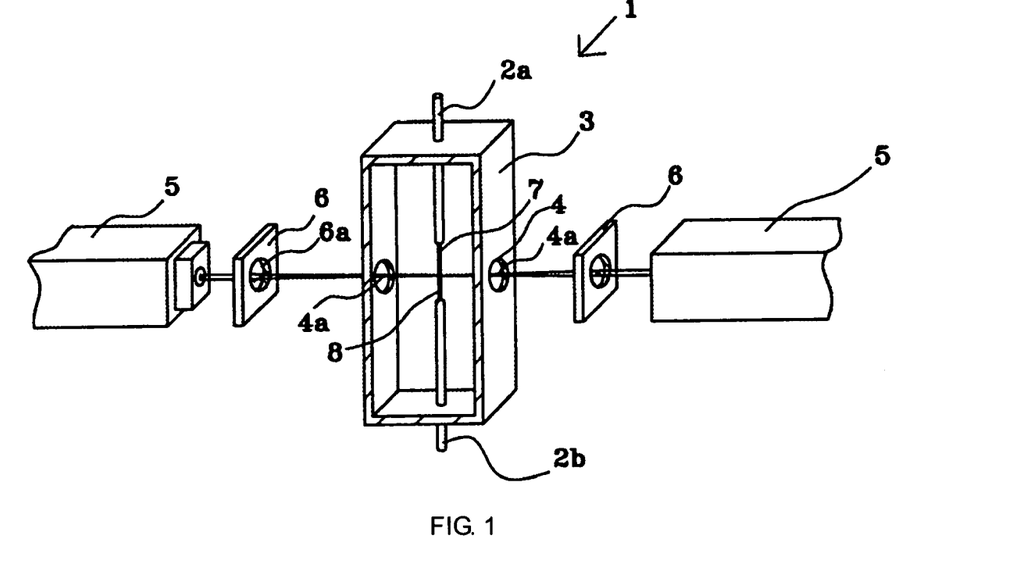
FIG. 1 is a schematic perspective view of a laser FZ apparatus for use in an embodiment of the present invention.

An apparatus for producing a single crystal which is suitable for realization of the above-described production method will be described. FIG. 1 is a schematic perspective view of a laser FZ (Floating Zone) apparatus which is used according to the present invention.

The laser FZ apparatus 1 comprises laser devices 5 which generate laser beams, a box 3 which also functions as a heat-radiating plate, and a shaft 2 capable of being vertically moved in the box 3. The shaft 2 is a rod-shaped supporting device which can be separated into an upper shaft 2a and a lower shaft 2b, vertically extends through the upper and lower surfaces of the box 3, and is formed so as to be moved in the vertical direction. Pieces to be supported can be held on the upper shaft 2a and the lower shaft 2b, respectively. Windows having window-lenses 4a fitted therein are provided on both side-faces of the box 3 in such a manner that the joining portion of the piece supported on the shaft 2a and the piece supported on the shaft 2b can be irradiated with laser beams in concentration. The laser devices 5 are disposed on both sides of the box 3 in such a manner that laser beams can be irradiated through both of the windows 4 of the box 3. Laser beams irradiated by the laser devices 5 positioned on both sides of the box 3 pass through the window lenses fitted in the windows 4 of the box 3. Thus, the pieces supported on the shaft 2 are irradiated with the laser beams in concentration from the opposite directions.

As described above, the shaft 2 has such a structure that the shaft 2 can be moved in the axial direction. Thus, the irradiation area of the laser beams irradiated to the pieces supported on the shaft can be shifted. With the above-described structure, advantageously, the raw material bar and the seed crystal can be continuously melt-joined together, and also, the obtained melting zone can be continuously cooled. More specifically, the raw material bar is held on the upper shaft 2a, and the seed crystal is held on the lower shaft 2b. The one end of the raw material bar is irradiated with laser beams, and thus is melted. The melt-portion is caused to contact one end of the seed crystal held on the lower shaft 2b while light energy is applied to the melt-portion, whereby the raw material bar and the seed crystal are melted and joined to each other to form a melting zone. Then, the shaft 2 is moved downward in the axial direction. Thus, a further melting zone is formed on the raw material bar side of the melt-joined portion of the raw material bar and the seed crystal. Successively, the shaft 2 is moved downward in the axial direction, so that the melt-liquid is gradually cooled starting on the seed crystal side and is solidified. It should be noted that the raw material bar held on the upper shaft 2a and the seed crystal held on the lower shaft 2b may be caused to contact each other, and thereafter, the contact-portion is melted, and thus, the raw material bar and the seed crystal are melt-joined.

Preferably, the movement speed of the shaft is not more than 30 mm/hour, depending on the diameter of a TAG polycrystal used as a raw material. If the movement speed in the axial direction of the melting zone is higher than 30 mm/hour, the crystal can not be sufficiently melted, and thus, it is difficult to convert the melting-zone to a single crystal. In this case, the irradiation position of the laser beam is fixed, and the shaft 2 can be shifted in the axial direction. The laser FZ apparatus may have such a structure that laser beams can be shifted.

Regarding the laser devices 5 used here, preferably, the wavelength is in the range of from 1.6 μm to 100 μm. It should be noted that a wavelength of 100 μm is the maximum wavelength of light. A TAG single crystal can not absorb a laser beam of which the wavelength is less than 1.6 μm. Hence, the raw material bar can not sufficiently be melted if the wavelength is less than 1.6 μm. As a laser device with a wavelength of not less than 1.6 μm, a $CO_2$ gas laser is preferable. In the case of the $CO_2$ gas laser device, the wavelength of a laser beam irradiated is large. Thus, even if the crystal is a TAG polycrystal having a wide transparent wavelength zone, the crystal can efficiently absorb the laser beam, and the TAG polycrystal can be easily melt-joined. In addition, an excimer laser device may be employed.

As described above, the two laser devices 5 are disposed on both sides of the box 3, so that the shaft is irradiated with laser beams from both sides thereof. However, the positions of the laser devices 5 are not restricted to both sides of the box 3. Thus, it is necessary to apply light energy to the joined-portion of the TAG polycrystal and the seed crystal in concentration. At least three laser devices may be arranged, and laser beams are irradiated to the joined-portion from positions on the normal. Thus, the temperature-gradient can be set steeper, and the irradiation area can be increased by arrangement of plural laser beam oscillation sources as described above. Thus, a larger TAG single crystal can be provided.

Also, the intensity of a laser beam can be controlled by adjustment of the distances between the laser devices 5 and the shaft 2 on which the paramagnetic garnet single crystal 7 and the seed crystal 8 are held. The laser beams can be appropriately controlled by adjustment of the size of a crystal to be formed, the size of the box 3, the focal distances of the lenses 4, and so forth.

Also, according to the present invention, to irradiate the end of a TAG polycrystal with laser beams in a greater concentration, preferably, a collective lens member 6 is further provided. More specifically, the collective lens member 6 is arranged in such a position that a collective lens 6a of the member 6 exists on the line passing through the windows of the box 3 and the laser oscillation ports 5a, and laser beams can be irradiated through the windows of the box 3 to the end of a pieces supported on the upper shaft 2a. The collective lenses 6a are not necessarily the same as the window lenses 4a of the windows 4 of the box 3. In the case where a $CO_2$ gas laser is employed, preferably, the collective lenses 6a are made of ZnSe. Furthermore, means other than collective lenses may be used, provided that the means can collect a laser beam.

In the above-description, as the pieces to be supported, the raw material bar and the seed crystal are used. The raw material bar is held on the shaft 2a, and the seed crystal is held on the shaft 2b. On the other hand, the seed crystal may be held on the shaft 2a, and the raw material bar may be held on the shaft 2b. Moreover, the upper shafts 2a and 2b may be rotated at the same speed and in the same direction, so that laser beams can be irradiated to a wide area of the joined portion of the piece held on the shaft 2a and the piece held on the shaft 2b.

The TAG single crystal is a coincidently melting type compound. Accordingly, the single crystal may be grown by the Czochralski method or the like, in addition to the above-described laser FZ method.

The TAG single crystal and the TGG single crystal, obtained by the production method for the terbium type paramagnetic garnet single crystal of the present invention, can be used in magneto-optical devices, more specifically, optical isolators, optical attenuators, optical switches, optical circulators, and so forth. In addition, the TAG single crystal and the TGG single crystal can be used as different types of magneto-optical sensor materials for rotation sensors, flow-rate sensors, current sensors, and so forth.

Figure 5:
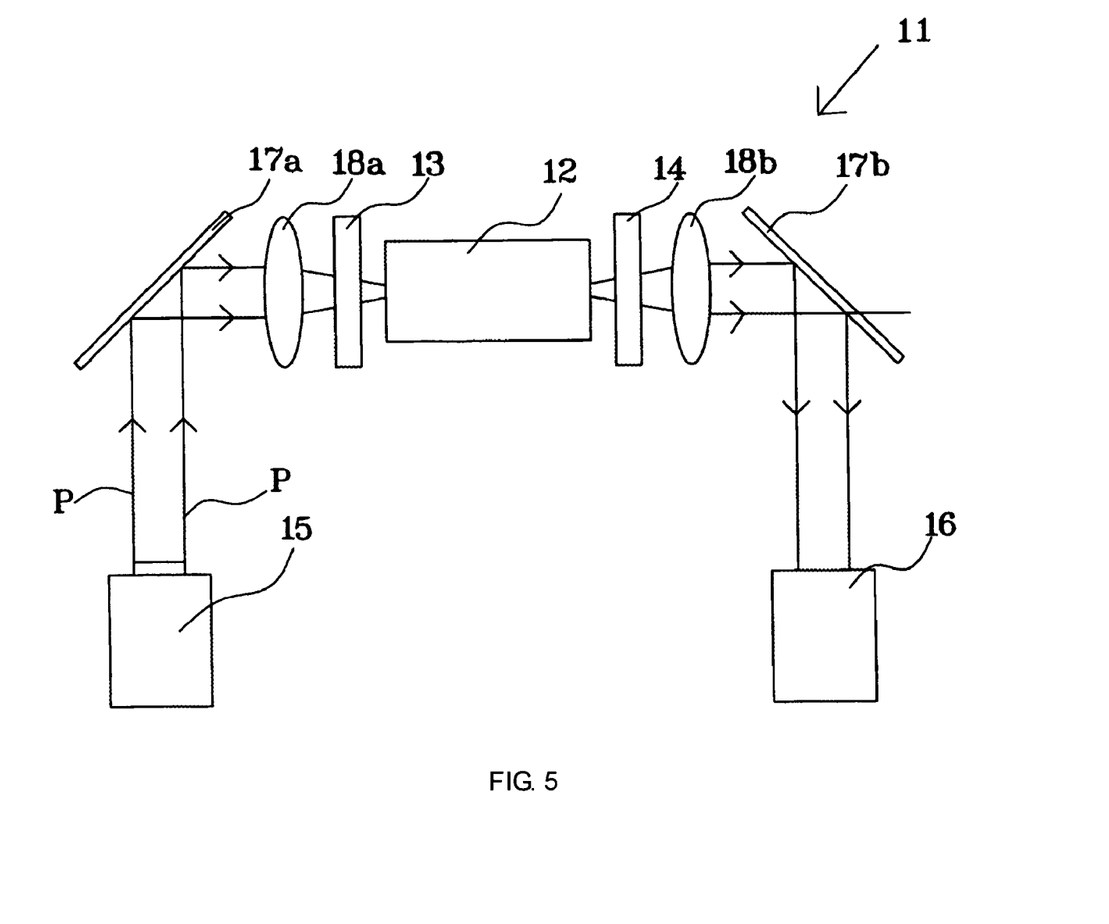
FIG. 5 schematically shows the structure of a magneto-optical device according to an embodiment of the present invention.

An embodiment of the magneto-optical device of the present invention will be described with reference to a magneto-optical sensor shown in FIG. 5. In the below-description, the term "optical axis" has a general meaning used for description of a light propagation line. Moreover, the term "incidence" means a direction in which a light beam irradiated by a light source enters the magneto-optical sensor, and the term "outgoing" means a direction in which the light beam exits from the magneto-optical sensor. FIG. 5 schematically shows the constitution of the magneto-optical sensor of the present invention. The magneto-optical sensor 11 comprises a Faraday rotor 12, a polarizer 13, an analyzer 14, a light-irradiating means 15, and a light-sensing means 16. In this case, the polarizer 13 is disposed on the incident side of the Faraday rotor 12, while the analyzer 14 is arranged in parallel to the optical axis on the outgoing side of the Faraday rotor 12. The polarizer 13 and the analyzer 14 are disposed in such a manner that the polarization planes thereof are perpendicular to the optical axis, so that the optical axis passing through the Faraday rotor 12 can pass through the polarization planes. The light irradiating means 15 is provided in such a position that a light beam can be made incident upon the polarizer 13. That is, the light irradiating means 15 is not necessarily disposed along the optical axis passing through the Faraday rotor 12. For example, a total reflecting mirror 17a may be provided between the light irradiating means 15 and the polarizer 13. Thus, a light beam is reflected from the total reflecting mirror 17a, and the optical path is changed. The magneto-optical sensor 11 can be reduced in size due to the reflecting mirror 17a provided between the light irradiating means 15 and the polarizer 13. Moreover, a total reflecting mirror 17b may be provided between the analyzer 14 and the light-sensing means 16 for the same reason as that for the total reflecting mirror 17a. Moreover, collective lenses 18a and 18b may be provided between the total reflecting mirror 17a and the polarizer 13 and between the total reflecting mirror 17b and the analyzer 14, respectively. In this case, a light beam can be efficiently made incident on the Faraday rotor 12 due to the collective lenses 18a provided. Moreover, a light beam can be efficiently made on the light sensing means 16 due to the collective lens 18b provided. Preferably, the terbium type paramagnetic garnet single crystal of the present invention can be used as the Faraday rotor 12 of the above-described magneto-optical sensor.

It is assumed that an impeller having permanent magnets attached thereon is arranged on the side of the Faraday rotor to generate a magnetic field, and the magnetic field is applied in parallel to the optical axis of the Faraday rotor. Based on the assumption, the action of the above-described magneto-optical sensor will be described below. First, a light beam irradiated by the light irradiating means 15 reflects on the total reflecting mirror 17a at an angle of 90° in such a manner that the reflected light beam becomes parallel to the optical axis passing through the Faraday rotor 12. The reflected light beam is collected by the collective lens 18b, and passes through the polarizer 13. Thus, the light beam having the same polarization plane as the polarizer 13 is incident upon the Faraday rotor 12. In this case, the polarization plane of the incident light beam is rotated by an amount corresponding to the Faraday rotational angle with respect to the propagation direction of the light beam in the Faraday rotor 12, due to the Faraday effect. Thus, the light beam outgoing from the Faraday rotor 12 passes through the analyzer 14, so that the light beam having the same polarization plane as the analyzer 14 can be output. The light beam outgoing from the analyzer 14 passes through the collective lens 18b, and thereafter, the light beam is reflected on the total reflecting mirror 17b at an angle of 90° to the optical axis. Regarding the reflected light beam, the light-quantity is detected by the light-sensing means 16.

[Experiment 1]

EXAMPLE 1

1. First Process

First, as starting raw materials for paramagnetic garnet polycrystals, $Tb_4O_7$ (purity: 99.9%), $Al_2O_3$ (purity: 99.99%), and $Pr_2O_3$ (purity: 99.9%) were prepared in such a manner that the grown crystals had the compositions of samples 1 to 5 shown in Table 1. Then, toluene and a dispersant were added to the mixed powder of the starting raw materials. The mixed powder was mixed and crushed for about 48 hours by means of balls. An organic binder was added to the formed liquid-mixture, and further mixed for 24 hours. Thus, the obtained slurry-like mixture was de-aired, and formed into a sheet with a thickness of about 50 µm by means of a squeegee. Plural raw material sheets formed as described above were laminated, and press-bonded together by means of a hydrostatic press. Then, the laminate was cut into rectangles. Thus obtained laminate chips were fired at 1600° C. for 2 hours. Thus, TAG type polycrystals for the samples 1 to 5, having a rod shape, was produced. The sintering density of the TAG polycrystals was 80%.

2. Second Process

Each of the TAG type polycrystals 7 for the samples 1 to 5, produced in the first process, was placed in the above-described laser FZ apparatus 1 in such a manner that each TAG type polycrystal was held on one end of the upper shaft 2a of the laser FZ apparatus. A seed crystal 8 consisting of a TAG single crystal was placed on one end of the lower shaft 2b. The inside of the box 3 was under the atmosphere. Laser beams were irradiated by the laser devices 5, so that the end of the TAG polycrystal 7 disposed on the one-end of the upper shaft 2a was heated and thus melted. The melted part of the TAG polycrystal 7 was joined to the one-end of the seed crystal 8 disposed on the lower shaft 2b.

3. Third Process

Subsequently, the melt-joined-portion of the end of each of the TAG polycrystals 7 for the samples 1 to 5 and the end of the seed crystal 8 was irradiated with laser beams. Thus, a melting zone was formed. In this case, the distance between the laser devices and the melting zone was about 50 cm. More specifically, the laser devices used here were $CO_2$ gas laser devices which can output a $CO_2$ gas laser beam with a wavelength of 10.6 µm. The output was 60 W.

Subsequently, the shaft was moved downward in the axial direction at a speed of 30 mm/hour or lower. Thereby, the laser-beam irradiation area was shifted toward the raw material bar side of the melt-joined portion. The melt-liquid existing on the seed crystal side in the melting zone was cooled and thus solidified. The obtained crystals were taken as the samples 1 to 5. The shapes of the obtained crystals were determined. The crystals were fibrous, having a diameter of 1 mm and a length of 27 mm.

EXAMPLE 2

Crystals were produced in the same manner as that of Example 1 except that as starting raw materials for paramagnetic garnet polycrystals, $Tb_4O_7$ (purity: 99.9%), $Al_2O_3$ (purity: 99.99%), and $CeO_2$ (purity: 99.9%) were prepared so that the grown crystals had the compositions of the samples 6 to 9 shown in Table 1, and the crystals were grown in an reducing atmosphere.

COMPARATIVE EXAMPLE 1

A crystal was produced in the same manner as that of Example 1 except that as starting raw materials for a paramagnetic garnet polycrystal, $Tb_4O_7$ (purity: 99.9%) and $Al_2O_3$ (purity: 99.99%) were prepared, and a pure TAG single crystal having the crystal composition of the sample 10 shown in Table 1 was produced.

COMPARATIVE EXAMPLE 2

Crystals were produced in the same manner as that of Example 1 except that as starting raw materials for paramagnetic garnet polycrystals, $Tb_4O_7$ (purity: 99.9%), $Al_2O_3$ (purity: 99.99%), $Nd_2O_3$ (purity: 99.9%), $Sm_2O_3$ (purity: 99.9%), and $Eu_2O_3$ (purity: 99.9%) were prepared, and the crystals had the crystal compositions of the TAG type polycrystals of the samples 11 to 13 shown in Table 1.

It was evaluated whether the crystals of the samples 1 to 13 produced as described above were the object single crystals or not according to the method described below.

Figure 2:
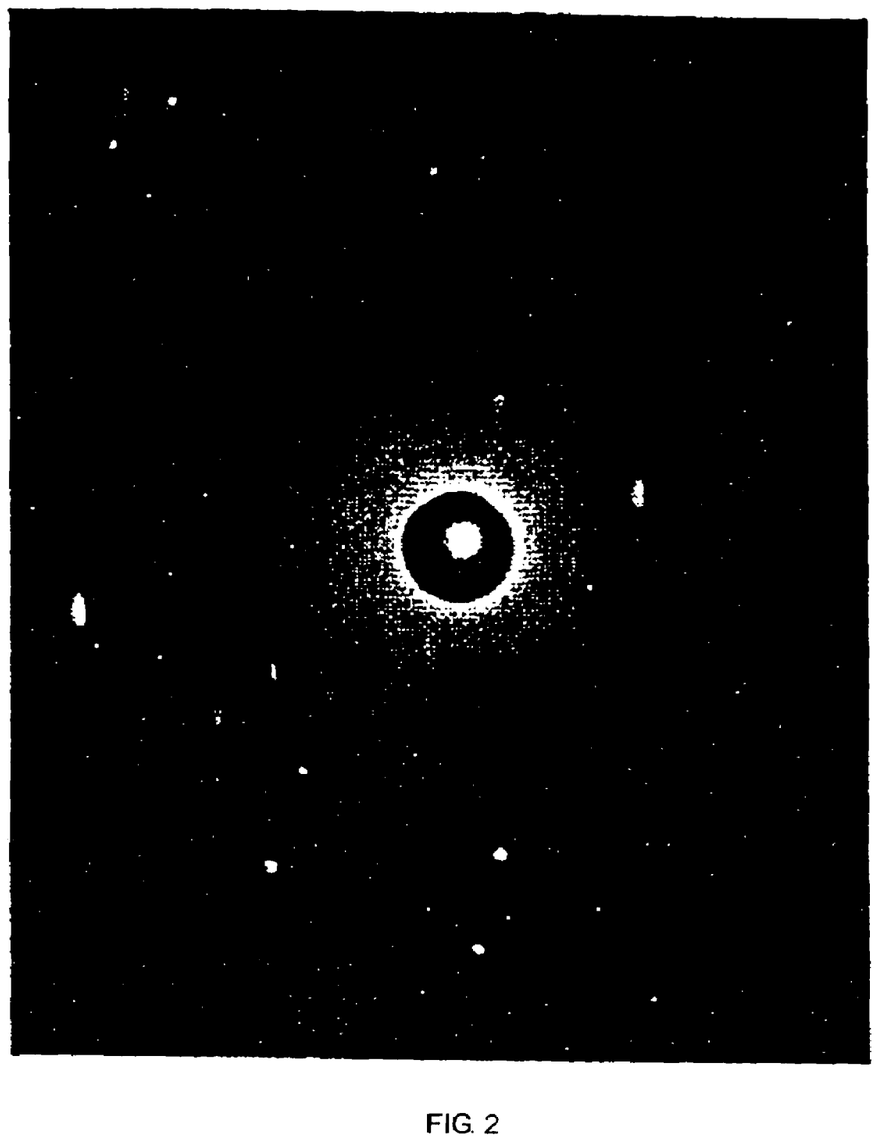
FIG. 2 is a reflection-type X-ray Laue photograph of sample 4 of Table 1 according to the present invention.
Figure 3:
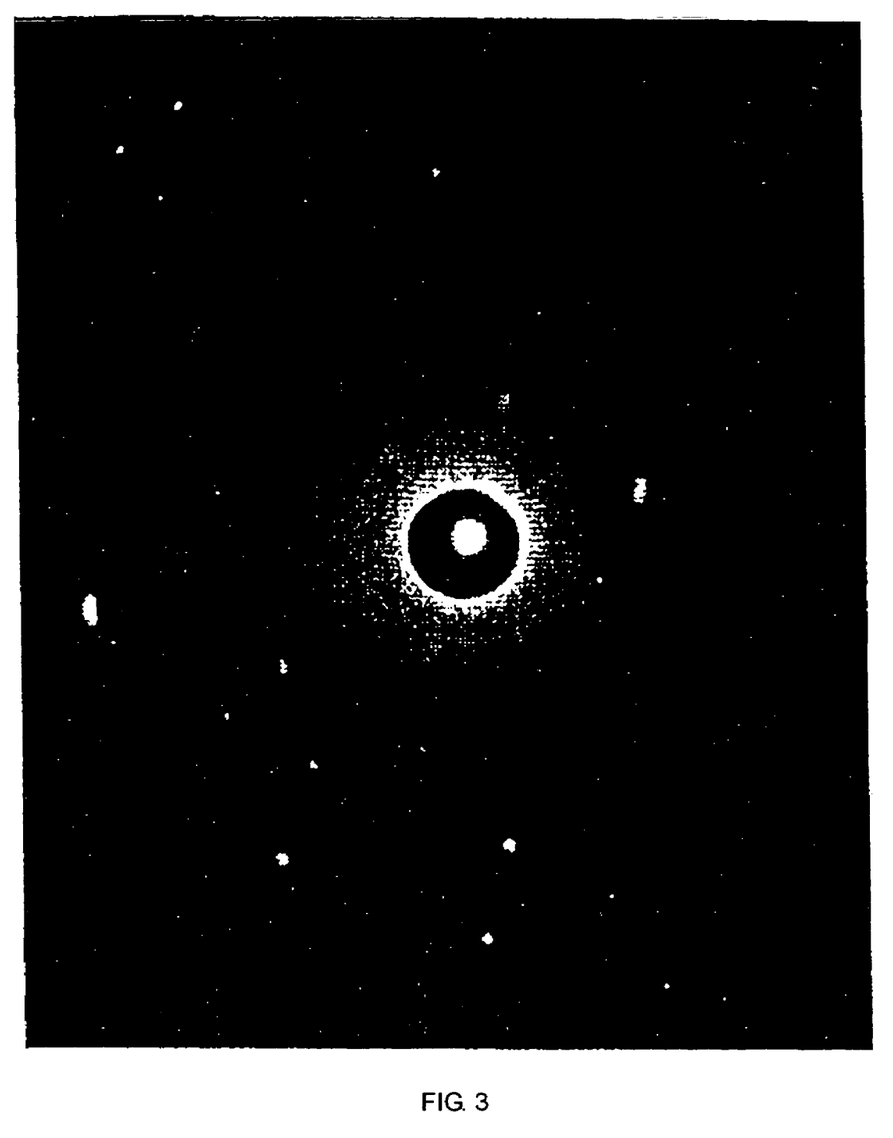
FIG. 3 is a reflection-type X-ray Laue photograph of sample 9 of Table 1 according to the present invention.
Figure 4:
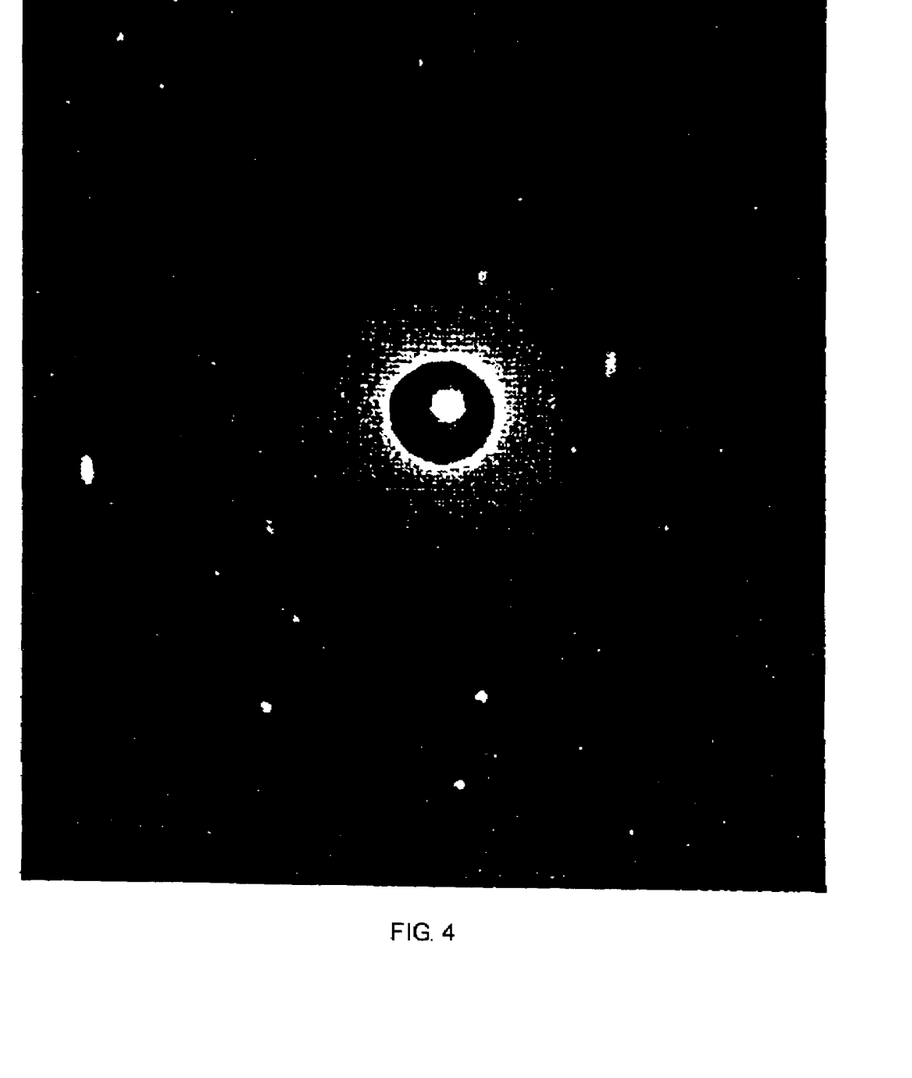
FIG. 4 is a reflection-type X-ray Laue photograph of a reference sample.

Regarding the sample 4 obtained in Example 1, the sample 9 obtained in Example 2, and the pure TAG single crystal of the sample 10 obtained in Comparative Example 1, the reflection type X-ray Laue photographs were taken. FIGS. 2 to 4 show the photographs of the samples 4, 5, and 10 in that order. As seen in FIGS. 2 to 4, the reflection type Laue images of the TAG single crystals are coincident with each other, even in the case where Pr or Ce is substituted for Tb sites. Thus, it is seen that the control of a growing-direction could be performed. Thus, it is seen that the samples 4 and 9 produced according to the production method of the present invention are terbium.aluminum paramagnetic garnet single crystals.

Then, the crystals of the samples 1 to 13 were cut into a disc shape, and mirror-finished by polishing with a high-precision polishing device. The Faraday rotor 2 was irradiated with He—Ne laser beams with an output of 1 mW and a wavelength of 633 nm while a magnetic field (H) of 1 kOe was applied. Then, regarding the light beam outgoing from the Faraday rotor, the Faraday rotation angle ($\theta_f$) was determined by the Cross Nicol method. The value was substituted for $\theta_f$ of $V=\theta_f/(d \times H)$. Thus, the effective Verdet constant was determined. Table 1 shows the results.

TABLE 1

| Sample number | Crystal composition | Verdet constant (°/Oe · cm) |
|---|---|---|
| *1 | $Tb_{2.991}Pr_{0.009}Al_5O_{12}$ | 0.0097 |
| 2 | $Tb_{2.8}Pr_{0.2}Al_5O_{12}$ | 0.0140 |
| 3 | $Tb_{2.5}Pr_{0.5}Al_5O_{12}$ | 0.0350 |
| 4 | $Tb_2Pr_1Al_5O_{12}$ | 0.0700 |
| 5 | $Tb_1Pr_2Al_5O_{12}$ | 0.1400 |
| *6 | $Tb_{2.991}Ce_{0.009}Al_5O_{12}$ | 0.0100 |
| 7 | $Tb_{2.8}Ce_{0.2}Al_5O_{12}$ | 0.0160 |
| 8 | $Tb_{2.5}Ce_{0.5}Al_5O_{12}$ | 0.0400 |
| 9 | $Tb_2Ce_1Al_5O_{12}$ | 0.0800 |
| *10 | $Tb_3Al_5O_{12}$ | 0.0092 |
| *11 | $Tb_{2.8}Nd_{0.2}Al_5O_{12}$ | 0.0090 |
| *12 | $Tb_{2.8}Sm_{0.2}Al_5O_{12}$ | — |
| *13 | $Tb_{2.8}Eu_{0.2}Al_5O_{12}$ | 0.0079 |

As seen in Table 1, the Verdet constants of the samples 11 to 13 in which at least one of cerium and praseodymium is not contained, and the terbium is replaced by another additive are smaller compared to the Verdet constant of the sample 10 which is a pure TAG single crystal. On the other hand, the Verdet constants of the samples 2 to 5 and the samples 7 to 9, which are within the scope of the present invention, are larger compared to the Verdet constant of the sample 10 which is a pure TAG single crystal. Regarding the samples 1 to 6 in which the composition ratios by number of cerium and praseodymium are less than 0.01, it is seen that the effects of the cerium and the praseodymium are not so sufficient to increase the Verdet constants. The sample 12 absorbed a He—Ne laser beam with a wavelength of 633 µm, and thus, the determination was impossible.

[Experiment 2]

EXAMPLE 3

First, as starting raw materials for paramagnetic garnet, $Tb_4O_7$ (purity: 99.9%), $Ga_2O_3$ (purity: 99.99%), and $Pr_2O_3$ (purity: 99.9%) were prepared in such a manner that the crystals had the compositions of the samples 14 to 18 shown in Table 2. The prepared raw materials, together with balls, were placed into a plastic container, and dry-mixed for one hour. The balls and the raw materials in the plastic container were placed into a mesh basket, so that only the balls were removed. The raw materials were placed into an Ir-made crucible, and was calcined at a temperature of 1200° C. for 2 hours in the atmosphere in an electrical furnace. The calcined powder was sieved through a mesh-sieve and charged into a rubber mold. The powder was pressed with a hydrostatic press at a pressure of 2000 kgf/cm², and in this state, was let to stand for 1 minute. Thus, the bulk density of the raw materials was increased. The pressed raw materials were charged into an Ir-made crucible, placed in the chamber of a high frequency induction heating device. The crucible was high-frequency induction-heated, and thus, the temperatures of the raw materials rose. In this case, the inside of the chamber was set under the atmosphere for the crystal-growth. After it was confirmed that the raw materials in the crucible were melted, the melt-liquid was made to contact the TGG single crystal as a seed crystal. After the melt-liquid and the TGG single crystal were kept in sufficient contact with each other, the melt-liquid was lifted at a speed of 1 mm/h while it was rotated at a rotational speed of 4 rpm. Thus, the TGG single crystals of the samples 14 to 18 were produced. The obtained crystals had a bulk shape with a diameter of 50 mm and a length of 100 mm.

EXAMPLE 4

Crystals were produced in the same manner as that of Example 3 except that as raw materials for paramagnetic garnet polycrystals, $Tb_4O_7$ (purity: 99.9%), $Ga_2O_3$ (purity: 99.99%), and $CeO_2$ (purity: 99.9%) were prepared, the crystals had the compositions of the samples 19 to 23 shown in Table 2, and the crystals were grown in an reducing atmosphere.

COMPARATIVE EXAMPLE 3

A crystal was produced in the same manner as that of Example 3 except that as raw materials for a paramagnetic garnet polycrystal, $Tb_4O_7$ (purity: 99.9%) and $Ga_2O_3$ (purity: 99.99%) were prepared, and a pure TAG single crystal having the crystal composition of the sample 24 shown in Table 2 was produced.

COMPARATIVE EXAMPLE 4

Crystals were produced in the same manner as that of Example 3 except that as raw materials for paramagnetic garnet polycrystals, $Tb_4O_7$ (purity: 99.9%) $Ga_2O_3$ (purity: 99.99%), $Nd_2O_3$ (purity: 99.9%), $Sm_2O_3$ (purity: 99.9%), and $Eu_2O_3$ (purity: 99.9%) were prepared, and the crystals had the crystal compositions of the TGG type polycrystals of the samples 25 to 27 shown in Table 2.

Then, the crystals of the samples 14 to 27 were cut into a disc shape, and mirror-finished by polishing with a high-precision polishing device. The Faraday rotor 2 was irradiated with He—Ne laser beams with an output of 1 mW and a wavelength of 633 nm while a magnetic field (H) of 1 kOe was applied. Then, regarding the light beam outgoing from the Faraday rotor, the Faraday rotation angle ($\theta_f$) was determined by the Cross Nicol method. The value was substituted for $\theta_f$ of $V=\theta_f/(d \times H)$. Thus, the effective Verdet constant was determined. Table 2 shows the results.

TABLE 2

| Sample number | Crystal composition | Verdet constant (°/Oe · cm) |
|---|---|---|
| *14 | $Tb_{2.995}Pr_{0.005}Ga_5O_{12}$ | 0.0077 |
| 15 | $Tb_{2.9}Pr_{0.1}Ga_5O_{12}$ | 0.0105 |
| 16 | $Tb_{2.8}Pr_{0.2}Ga_5O_{12}$ | 0.0135 |
| 17 | $Tb_2Pr_1Ga_5O_{12}$ | 0.0375 |
| 18 | $Tb_1Pr_2Ga_5O_{12}$ | 0.0675 |
| *19 | $Tb_{2.995}Ce_{0.005}Ga_5O_{12}$ | 0.0078 |
| 20 | $Tb_{2.9}Ce_{0.1}Ga_5O_{12}$ | 0.0115 |
| 21 | $Tb_{2.85}Ce_{0.15}Ga_5O_{12}$ | 0.0140 |
| 22 | $Tb_{2.3}Ce_{0.7}Ga_5O_{12}$ | 0.0355 |
| 23 | $Tb_2Ce_1Ga_5O_{12}$ | 0.0475 |
| *24 | $Tb_3Ga_5O_{12}$ | 0.0075 |
| *25 | $Tb_{2.8}Nd_{0.2}Ga_5O_{12}$ | 0.0090 |

TABLE 2-continued

| Sample number | Crystal composition | Verdet constant (°/Oe · cm) |
|---|---|---|
| *26 | $Tb_{2.8}Sm_{0.2}Ga_5O_{12}$ | — |
| *27 | $Tb_{2.8}Eu_{0.2}Ga_5O_{12}$ | 0.0079 |

As seen in Table 2, the Verdet constants of the samples 25 to 27 in which at least one of cerium and praseodymium is not contained, and a part of the terbium is replaced by another additive are smaller compared to the Verdet constant of the sample 24 which is a pure TGG single crystal. On the other hand, it is seen that the Verdet constants of the samples 15 to 18 and the samples 20 to 23, which are within the scope of the present invention, are larger compared with the Verdet constant of the sample 24 which is the pure TAG single crystal. Regarding the samples 14 and 19 in which the amounts of cerium and praseodymium are less than 0.01. Thus, it is seen that the effects of the cerium and the praseodymium are not so sufficient to increase the Verdet constants. The sample 26 absorbed a He—Ne laser beam with a wavelength of 633 μm, and thus, the determination was impossible.

[Experiment 3]

First, the single crystal of the sample 2 as a Faraday rotor, obtained in Example 1 in which praseodymium was substituted for a part of the terbium, the single crystal of the sample 7, obtained in Example 2, in which cerium was substituted for a part of the terbium, and the pure single crystal of the sample 10 obtained in Comparative Example 1 were prepared. Each of the single crystals was processed into a columnar shape with a length of 1 mm and a diameter in cross-section of 1 mm. The ratio of the length from one end from the other end of the Faraday rotor to the diameter of the Faraday rotor was 1. Then, a polarizer and an analyzer made of rutile and collective lenses made of quartz were prepared. One of the collective lenses, the polarizer, the Faraday rotor, the analyzer, and the other collective lens were arranged in the optical-axial direction in that order from the incident side of a light beam. Total reflecting mirrors were provided between a light irradiating means and the collective lens and between a photodetector as a light-sensing means and the collective lens. The light irradiating means was disposed in such a position that a light beam irradiated by the light irradiating means could be reflected on the total reflecting mirror at an angle of 90°, and the reflected light beam would become parallel to the Faraday rotor. Moreover, the light-sensing means was provided in such a position that a light beam outgoing from the Faraday rotor would be reflected on the total reflecting mirror at an angle 90°. Thus, magnetic sensors each having a configuration shown in FIG. 5 was produced using the samples 2, 7, and 10, respectively.

Figure 6:
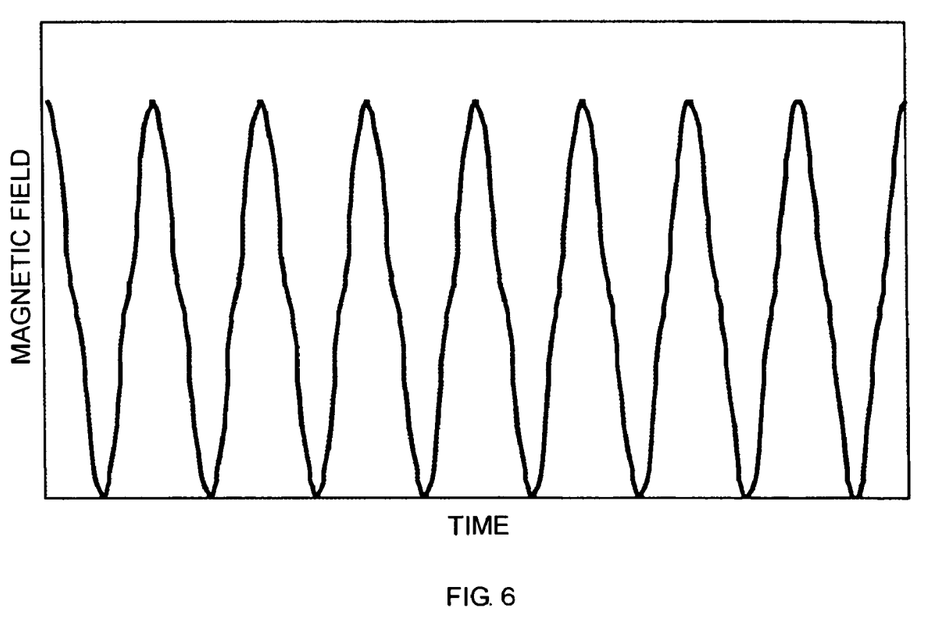
FIG. 6 shows the magnetic field—time characteristics of samples 2, 7, and 10 of Table 1.
Figure 7:
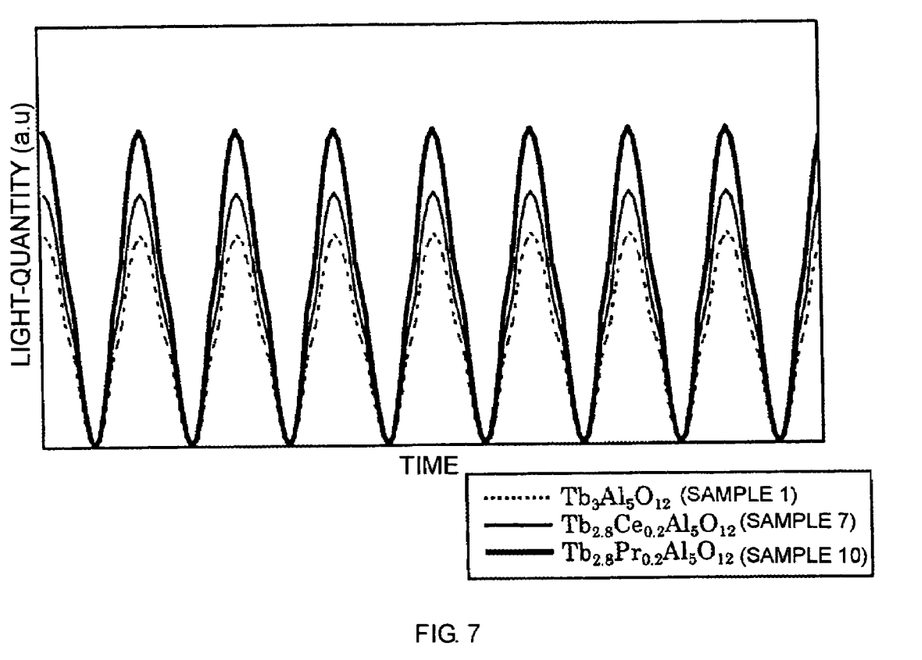
FIG. 7 shows the light-quantity—time characteristics of the samples 2, 7, and 10 of Table 1.

The variation of a magnetic field was determined by the method described below. First, an impeller having magnets at the tops thereof was disposed on the side of the Faraday rotor of each magneto-optical sensor. The impeller was rotated by means of a motor, so that the magnetic field intensity was in the range of 50 Oe to 250 Oe. FIG. 6 illustrates the variation of the magnetic field. Then, each magneto-optical sensor was irradiated with a laser beam by means of a He—Ne laser (wavelength: 633 nm). The change of the quantity of a light beam outgoing from the Faraday rotor with the variation of the magnetic field was determined by means of a photodetector. FIG. 7 shows the change of the quantity of light.

As seen in FIGS. 6 and 7 regarding the magneto-optical sensors using the Faraday rotors made of the samples 2, 7, and 10, the curve of FIG. 6 showing the magnetization-variation applied to the Faraday rotor and the curves of FIG. 7 showing the light-quantities detected by the photodetector have the same wave-form. This shows that all the variation of the magnetic field was converted to the light-quantity. Moreover, regarding the sample 2 in which praseodymium was substituted for a part of the terbium, and the sample 7 in which cerium was substituted for a part of the terbium, the difference between the detected light-quantities is larger compared to that in the sample 10 of the pure TAG single crystal. This shows that the magneto-optical sensors of the samples 2 and 7 have a high sensitivity.

In the above-description, typically, the terbium type paramagnetic garnet single crystal of the present invention is used in a magneto-optical sensor for measurement of electric current. In addition, the terbium type paramagnetic garnet single crystal can be used as a magneto-optical sensor material for rotation sensors, flow-rate sensors, and so forth. Moreover, the terbium type paramagnetic garnet single crystal of the present invention can be used in magneto-optical devices such as optical isolators, optical attenuators, optical switches, optical circulators, and so forth.

As described above, the terbium type garnet paramagnetic single crystal and the magneto-optical device of the present invention can be used in various fields in which the change of situations must be sensed by detection of a magnetic field with a light beam, e.g., the fields of electric power, motor-cars, plants, and so forth, optical communication fields in which light must be transmitted with stability.

The invention claimed is:

1. A terbium type paramagnetic garnet single crystal, wherein the single crystal is represented by the chemical formula: $(Tb_{3-x}M_x)N_5O_{12}$, in which M represents Ce, N represents at least one of Al and Ga, and x is in the range of $0.07 \leq x \leq 1$.

2. A terbium type paramagnetic garnet single crystal, wherein the single crystal is represented by the chemical formula: $(Tb_{3-x}M_x)N_5O_{12}$, in which M represents Pr, N represents at least one of Al and Ga, and x is in the range of $1 \leq x \leq 2$.

3. A magneto-optical device including, as a magneto-optical element, the terbium type paramagnetic garnet single crystal defined in claim 1.

4. A magneto-optical device including, as a magneto-optical element, the terbium type paramagnetic garnet single crystal defined in claim 2.

* * * * *